United States Patent
Conway et al.

(10) Patent No.: US 7,900,124 B2
(45) Date of Patent: Mar. 1, 2011

(54) BIT DETECTION FOR MULTITRACK DIGITAL DATA STORAGE

(75) Inventors: Thomas Conway, Lisnargy (IE);
Richard Conway, Annacotty (IE)

(73) Assignee: Koninklijke Philips Electronics N.V., Eindhoven (NL)

( * ) Notice: Subject to any disclaimer, the term of this patent is extended or adjusted under 35 U.S.C. 154(b) by 544 days.

(21) Appl. No.: 11/718,407

(22) PCT Filed: Nov. 7, 2005

(86) PCT No.: PCT/IB2005/053651
§ 371 (c)(1),
(2), (4) Date: May 2, 2007

(87) PCT Pub. No.: WO2006/048849
PCT Pub. Date: May 11, 2006

(65) Prior Publication Data
US 2009/0052293 A1    Feb. 26, 2009

Related U.S. Application Data

(60) Provisional application No. 60/625,797, filed on Nov. 8, 2004.

(51) Int. Cl.
*H03M 13/03* (2006.01)
*G11B 20/10* (2006.01)
(52) U.S. Cl. .............. 714/795; 369/59.22; 369/59.23; 375/341; 375/265
(58) Field of Classification Search .............. 369/59.22, 369/59.23; 375/341; 714/794
See application file for complete search history.

(56) References Cited

U.S. PATENT DOCUMENTS

| 5,257,355 | A  | * | 10/1993 | Akamatsu | 345/442 |
| 2007/0008855 | A1 | * | 1/2007 | Hekstra et al. | 369/59.23 |
| 2007/0014372 | A1 | * | 1/2007 | Hershbarger | 375/258 |

OTHER PUBLICATIONS

Miller C et al: "Image restoration with the Viterbi algorithm" Journal of the Optical Society of America. A, Optics and Image Science, vol. 17, No. 2, Feb. 2000, pp. 265-275, XP002277237 ISSN: 0018-9448.*
Hashimoto T: "A List-Type Reduced-Constraint Generalization of the Viterbi Algorithm" IEEE Transactions on Information Theory, IEEE Service Center, Piscataway, NJ, US, vol. 33, No. 6, Nov. 1, 1987, pp. 866-876, XP000575317 ISSN: 0018-9448.*
Xiao MA et al, "Iterative Detection/Decoding for Two-Track Partial Response Channels", IEEE Communications Letters, vol. 8, No. 7, Jul. 2004, pp. 464-466.
A.H.J. Immink et al, "Signal Processing and Coding for Two-Dimensional Optical Storage", IEEE Gobal Telecommunications Conference, vol. 7 or 7, Dec. 1, 2003, pp. 3904-3908.
Casey Miller, "Image Restoration With the Viterbi Algorithm" Journal of the Optical Society of Amercia, vol. 17, No. 2, Feb. 2000, pp. 265-275.
Erozan Kurtas et al, "Reduced Complexity Maxium Likelihood Sequence Estimation for Multitrack High-Density Magnetic Recording Channels", IEEE Transactions on Magnetics, vol. 35, No. 4, Jul. 1999, pp. 2187-2193.

* cited by examiner

*Primary Examiner* — Aristotelis Psitos

(57) ABSTRACT

The use of a multi-track format in both optical and magnetic data storage applications provides for a number of improvements to system performance including data density and data transfer rates. However, the full advantage in data density can only be achieved through the use of joint equalization and joint detection. The complexity of implementation of these functions arc addressed with a transform domain equalization architecture and a reduced complexity detection method based on a breadth first search of a time-varying trellis. The trellis results from a one dimensional representation of a two dimensional target response, obtained by arranging samples from adjacent tracks in a sequence that respects the original proximity of the samples.

16 Claims, 7 Drawing Sheets

BIT DETECTION FOR MULTITRACK DIGITAL DATA STORAGE

FIELD OF THE INVENTION

This present invention relates generally to the reading of information from a storage medium such as a magnetic recording data storage apparatus or an optical storage apparatus.

BACKGROUND OF THE INVENTION

The need to increase the storage density and data transfer rate of information storage media (such as magnetic or optical storage) is a well known goal in the art. In a typical such device, the data is stored formatted as a track in which the data is encoded as orientation of the magnetization of the media as in magnetic recording or the presence or absence of an optical mark in the case of optical storage. The data is retrieved with a read transducer element that produces a signal that varies with the encoded data on the storage medium. This signal is processed by a device known as a read channel whose purpose is to recover the original data with high reliability taking account of the characteristics of the storage medium and the read transducer.

As the data is stored at a high density, the response of the transducer is usually spread across a number of encoded data symbols on the medium. Hence the received signal from the read transducer is a combination of the encoded data symbol below the transducer as well as encoded data symbols before and after that symbol. This characteristic of the system is known as inter-symbol interference (ISI). It is well known in the art how to implement efficient read channels to account for this and recover the data reliably in the presence of such inter-symbol interference.

As the read transducer responds to encoded data symbols in the near vicinity, the tracks of encoded data are normally separated by a distance sufficient to ensure that interference from adjacent tracks is small enough to limit its effect on the data recovery process.

In order to achieve higher density storage, the distance between the tracks can be reduced. Furthermore, to achieve higher data transfer rates, the use of a multiple head transducer which consists of a number of read transducers ($N_R$) rigidly fixed together can be employed. In this case, a number of tracks can be written and/or read simultaneously thus resulting in an increase of data transfer rates by a factor $N_R$.

The resulting read signals then consist of interference in both the track direction as well as interference between tracks. Hence, there is a need to develop a read channel system that can take these signals and efficiently recover the original data with high reliability taking account of this two dimensional ISI.

SUMMARY OF THE INVENTION

The present invention discloses a device for the recovery of data read from a medium consisting of multiple tracks which are read simultaneously and in which the read signal for each track consist of contributions from multiple data symbols both from that track as well as other tracks.

The signals from each of the $N_R$ read transducers is individually processed with an automatic gain control process and then filtered with a low pass filter. Each signal is then sampled by an analogue to digital converter with a sampling frequency $F_{SAMPLE}$ to provide digital samples of each read signal. These $N_R$ groups of samples are then processed by a joint equalizer to produce $N_E$ digital samples. This is efficiently achieved by transforming groups of N samples from each row into a transform domain using a fast transform processor. A block of $N \times N_R$ samples is then processed by multiplying each element of the block by one coefficient for each output row required resulting in $N_E$ groups of N samples. Each of these groups are transformed back into the original domain using a fast inverse transform processor. By overlapping the groups of N samples, overall equalization is efficiently achieved. The equalization coefficients are chosen to equalize the read samples to a predetermined or programmable two dimensional partial response.

The $N_E$ output samples from the joint equalizer are processed by $N_E$ sample rate converters which re-sample the signal to provide symbol rate samples. These symbol rate samples are used by a joint detector which uses these samples and the knowledge of the two dimensional partial response that they are equalized to, to recover the original $N_D$ data samples. The joint detection is efficiently achieved by viewing the two dimensional partial response as a time varying one dimensional partial response and using a reduced state detection algorithm to recover the data. By reducing the number of states maintained in the detector, efficient detection can be practically achieved yet maintaining high detection performance.

To achieve the objective of the invention the A method for retrieving bits from a record carrier having the bits stored in marks in a two-dimensional pattern having a width of multiple rows of marks along a reading or writing direction of the two dimensional pattern, where more marks are distributed along a length of the rows than there are marks distributed across the width of the multiple rows, and where sampling the marks results in a sample of the signal waveform for a mark being affected by two dimensional intersymbol interference from adjacent marks, comprising the steps of:
  retrieving a sample;
  processing the sample using a trellis with a set of departure states and a set of arrival states,
  building up the trellis by converting each arrival state to a further departure state for use during a processing of the current sample,
  providing an output bit based on a backtracking operation or trace-back operation along the trellis over a certain backtracking depth, and is characterized in that the states of the trellis are constructed from the two-dimensional pattern by retrieving each subsequent sample corresponding to an adjacent mark from an adjacent row, that the trellis is a one dimensional trellis, and that each subsequent sample is used as an input for the one dimensional trellis.

By retrieving each subsequent sample corresponding to an adjacent mark from an adjacent row the detector input is converted from two-dimensional to one-dimensional and the subsequent trellis operation takes the original proximity of the samples into account when building up the trellis.

Since the task of the data detection has now been reduced to a one dimensional trellis by reading the two dimension array of marks in a one dimensional fashion that still covers the area needed to establish the intersymbol interference known techniques relating to trellises can be applied instead of having to revert to two dimensional trellis solutions. When compared to a row by row approach the present solution yields more reliable output bits because the intersymbol interference of the already processed adjacent bits can be considered immediately in the trellis. In the row by row approach the intersymbol interference can only be considered after adjacent rows have been detected.

In a further embodiment of the method, when the retrieval of the samples arrives at a boundary of the two dimensional array, the states of the trellis are constructed from the two-dimensional pattern by retrieving a subsequent sample corresponding to an adjacent mark bit from the same row once.

This defines the behavior at the boundary row of the two dimensional array.

By retrieving the subsequent sample from the same row once the detection moves forward in the reading direction and effectively inverts the direction in which the retrieval of the samples was moving.

In a further embodiment the marks corresponding to the subsequent samples form a meandering pattern across the rows.

When every time when the retrieval of the samples arrives at a boundary of the two dimensional array, the states of the trellis are constructed from the two-dimensional pattern by retrieving a subsequent sample corresponding to an adjacent mark bit from the same row once, the pattern that the retrieval forms when moving across the marks is a meandering pattern across the rows, the direction of the retrieval reversing at every boundary of the two dimensional array. The retrieval thus proceeds from the first row to the last row and subsequently inverts direction and starts from the last row again and proceeds to the first row again where the direction is inverted yet again and proceeds from the first row to the last row.

In a further embodiment the marks corresponding to the subsequent samples form a hatch pattern across the rows.

When reaching a boundary row of the two dimensional array the retrieval stops and continues at the other boundary row of the two dimensional array. The retrieval thus proceeds from the first row to the last row and subsequently starts from the first row again and proceeds to the last row again.

In a further embodiment the departure state of the one dimensional trellis comprises a first set of subsections of subsequent bits used when establishing a branch metric and a second a set of subsections of subsequent bits ignored when establishing a branch metric.

Since the one dimensional trellis is deriving the input samples from the two dimensional array the samples that correspond to marks that were adjacent in the two dimensional array are no longer adjacent but form two or more groups of samples.

When building up the trellis this translation in relationship must be considered.

In a further embodiment the channel response determines which subsequent bits are comprised in the first set of subsections of subsequent bits.

The channel response determines the relationship of the samples corresponding to adjacent marks with respect to the intersymbol interference and thus determines which set of subsections of subsequent bits is to be used when establishing a branch metric.

In a further embodiment the two dimensional array of marks is delineated by a boundary row comprising an a priori known boundary information and where the one dimensional trellis is a time variant one dimensional trellis.

Because the samples corresponding to the marks of the boundary row of a priori known boundary information form a special condition when building up of the trellis, the trellis is required to be a time variant trellis.

In a further embodiment the a priori known boundary information is a forced zero.

Using a forced zero as the a priory known boundary information allows an increase in the reliability of the detected data.

In a further embodiment the converting the arrival state to a further departure state for use during a processing of a next sample comprises performing a tree search operation and retaining only M states at each stage in the trellis.

By performing a tree search and forcing a restriction to a maximum of M stages, the complexity of the trellis is significantly reduced.

In a further embodiment each state comprises two branches.

By limiting each state to only two branches the complexity of the trellis is further reduced.

In a further embodiment the trellis is extended with a single branch for each of the forced zeros.

Since the forced zeros are a priory known it is not necessary to use more than one branch since there is no uncertainty in the sample corresponding to the forced zeros.

DETAILED DESCRIPTION OF THE INVENTION

Figure 1:
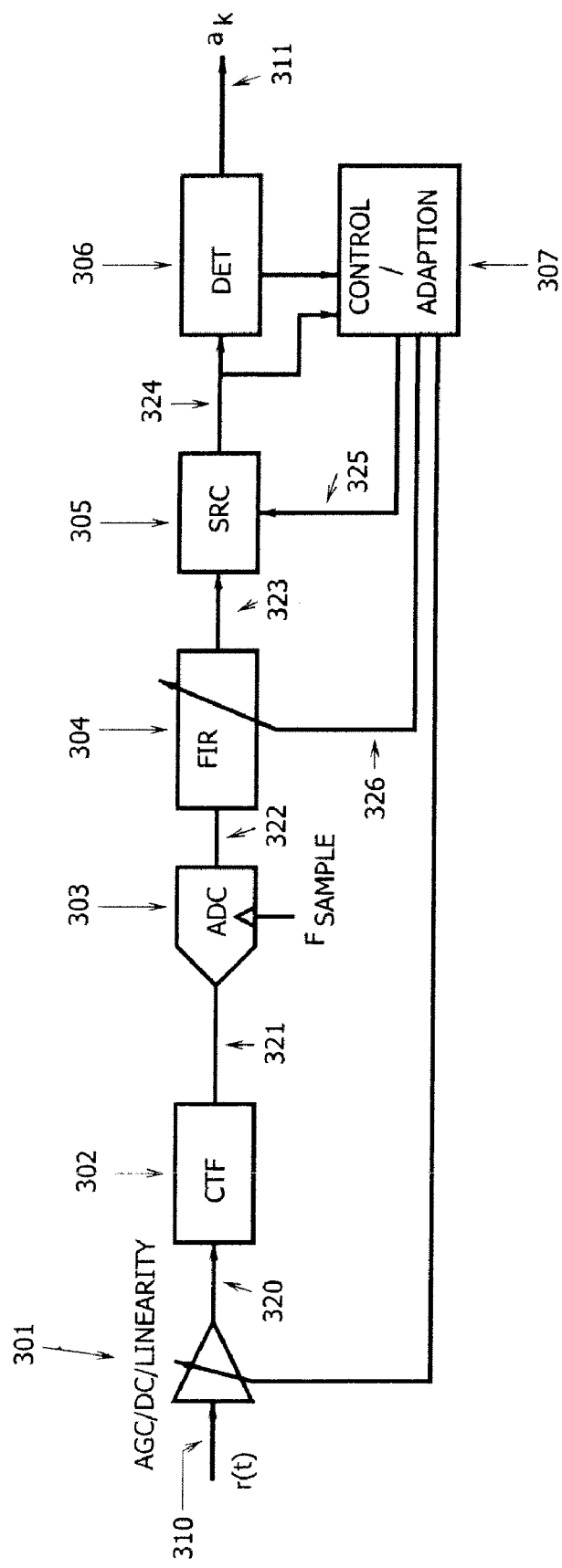
FIG. 1 depicts a typical read channel architecture for a single track data storage device as is known in the prior art.

The drawing in FIG. 1 shows a well known general architecture for the reliable detection of data from a single read transducer. The continuous time input signal 310 is passed through an analogue processing circuit 301 that provides variable gain, offset and linearity processing to compensate for the variability and non linearity of the read transducer.

This processing is usually controlled with information based on a control and adaption block 307 which can be implemented in various ways that are well known. The output signal 320 is filtered with a continuous time filter 302 to produce an output signal 321 that can be sampled with an analog to digital converter 303 to produce digital samples 321. These are further filtered in the digital domain by an FIR filter 304, whose coefficients can be adapted to shape the read signal to a predetermined or programmable target response. The output 323 of the FIR filter is resampled with a sample rate converter 305 to produce baud rate synchronous samples 324 that can be used by a detector system 306 to recover the original data bits 311 with good reliability. Such detectors are often based on the well known Viterbi algorithm and are required to be implemented to operate at high data rates yet achieve close to optimum detection performance. The control and adaption block 307 can use signals such as the baud rate synchronous samples 324 to produce control information to ensure the system starts correctly and can acquire the data and then track any slow varying changes in the characteristics of the read signal. The design and implementation of such systems are well understood.

Figure 2:
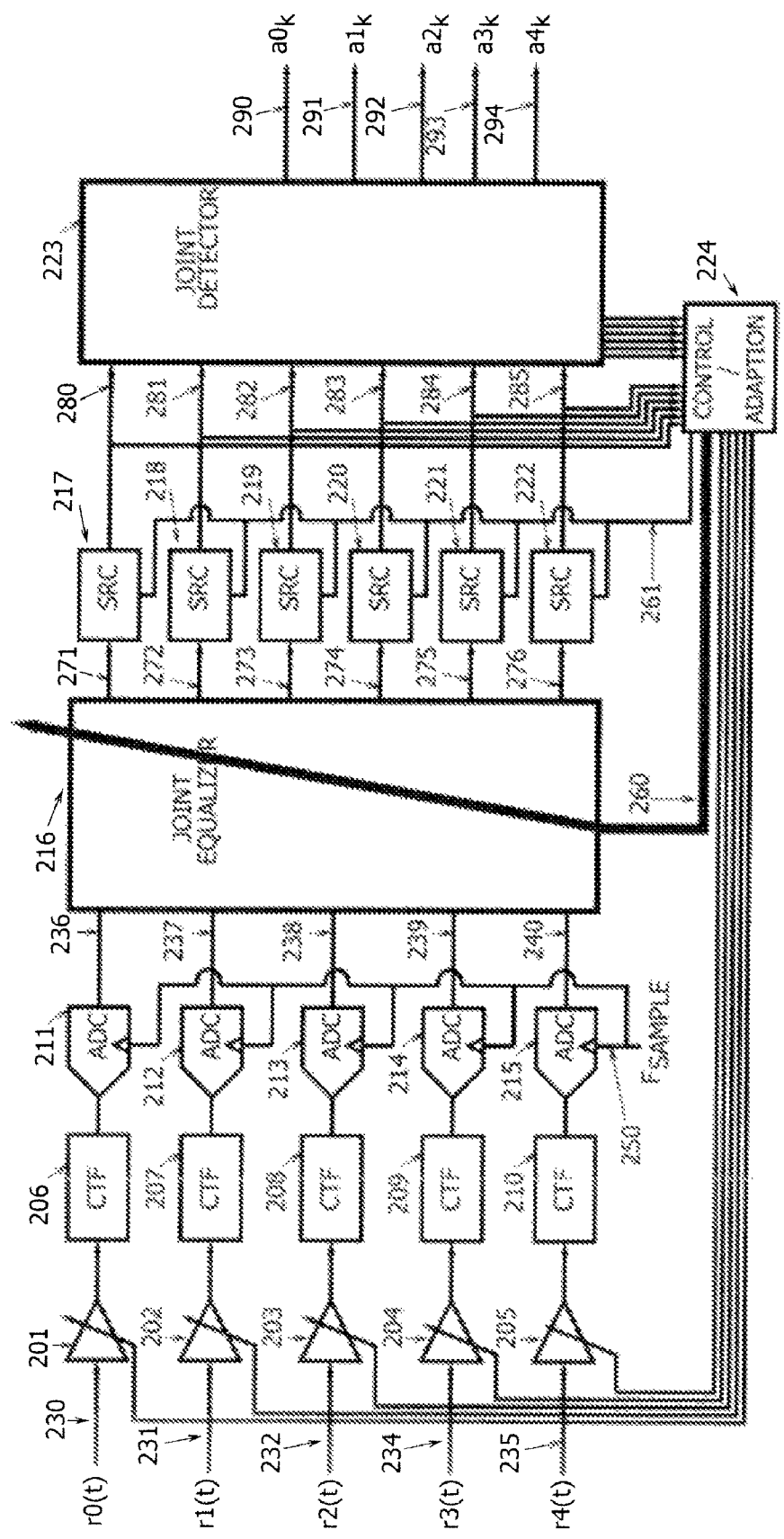
FIG. 2 depicts the disclosed read channel architecture for a multi track track data storage device.

The drawing in FIG. 2 shows the disclosed invention system which is capable of handling a multi-track read transducer in which the tracks are so close together, that the read signal has interference from adjacent tracks as well as along the tracks. This is known as two dimensional intersymbol interference and it is well known that it is difficult to handle such two dimensional intersymbol interference efficiently. In the drawing there are a number (five in this example) of parallel inputs 230, 231, 232, 234 and 235 which represent the continuous input signal from 5 transducers. These are all processed independently by analogue processing circuits 201, 202, 203, 204 and 205 in an identical fashion to that known in the prior art. Similarly the continuous time filters 206, 207, 208, 209 and 210 produce output signals that can be sampled with an analog to digital converters 211, 212, 213, 214 and 215 to produce digital samples 236, 237, 238, 239 and 240.

The disclosed invention in FIG. 2 uses a joint equalizer 216 to provide a two dimensional filtering function which shapes the two dimensional response of the read transducers to a predetermined or programmable target response. As the read transducers may vary slightly from one to another and the target responses may also be chosen differently from one track to another, the joint equalizer is required to support a different set of coefficients for each output 271, 272, 273, 274, 275 and 240. Furthermore, as the read transducers do not necessarily have to be aligned in space, there can be a fractional delay between their output again necessitating a different set of coefficients for each output. It can also be readily appreciated that the number of equalizer outputs (six shown in FIG. 2) may differ from the number of inputs (five shown in FIG. 2). Furthermore it can be seen that the joint equalizer can also apply a response that shifts the input samples in the adjacent track direction. With sufficiently close read transducers, this permits the effective alignment of the read transducers via adjustment of the equalizer coefficients rather than the physical movement of the transducers, thus permitting increase tracking accuracy. This invention discloses an efficient method for achieving this equalizing and is described in detail in section 1.

In FIG. 2, the outputs 271, 272, 273, 274, 275 and 240 of the joint equalizer 216 are then processed with a number (six in this example) of sample rate converters 217, 218, 219, 220, 221 and 222, which all operate independently but using a common resampling phase 261. The outputs 280, 281, 282, 283, 284 and 285 of these sample rate converters are baud rate samples of the equalized read signal and are used by the joint detector 223 as well as the control/adaption block 224. The functionality of the control/adaption block can be implemented in a similar manor to existing one dimensional read channels. The joint detector 223 takes the baud rate samples from the sample rate converters and uses these signal as well as knowledge of the target equalization response to provide reliable decisions 290, 291, 292, 293, and 294 of the stored data. It can be readily appreciated that the number of recovered data bits (five in this example) can be less than or equal to the number of equalizer outputs (six in this example). The practical and efficient implementation of the joint detector 223 is disclosed in this invention and is described in detail in section 5.

In summary, the drawing in FIG. 2 discloses a read channel architecture that is capable of reliable detection of data from an array of read transducers from a storage medium even in the presence of two dimensional intersymbol interference. It will be appreciated that the architecture disclosed relies on the efficient implementation of the joint equalizer 216 and the joint detector 223 in FIG. 2 and the following sections disclose how this can be achieved.

Figure 3:
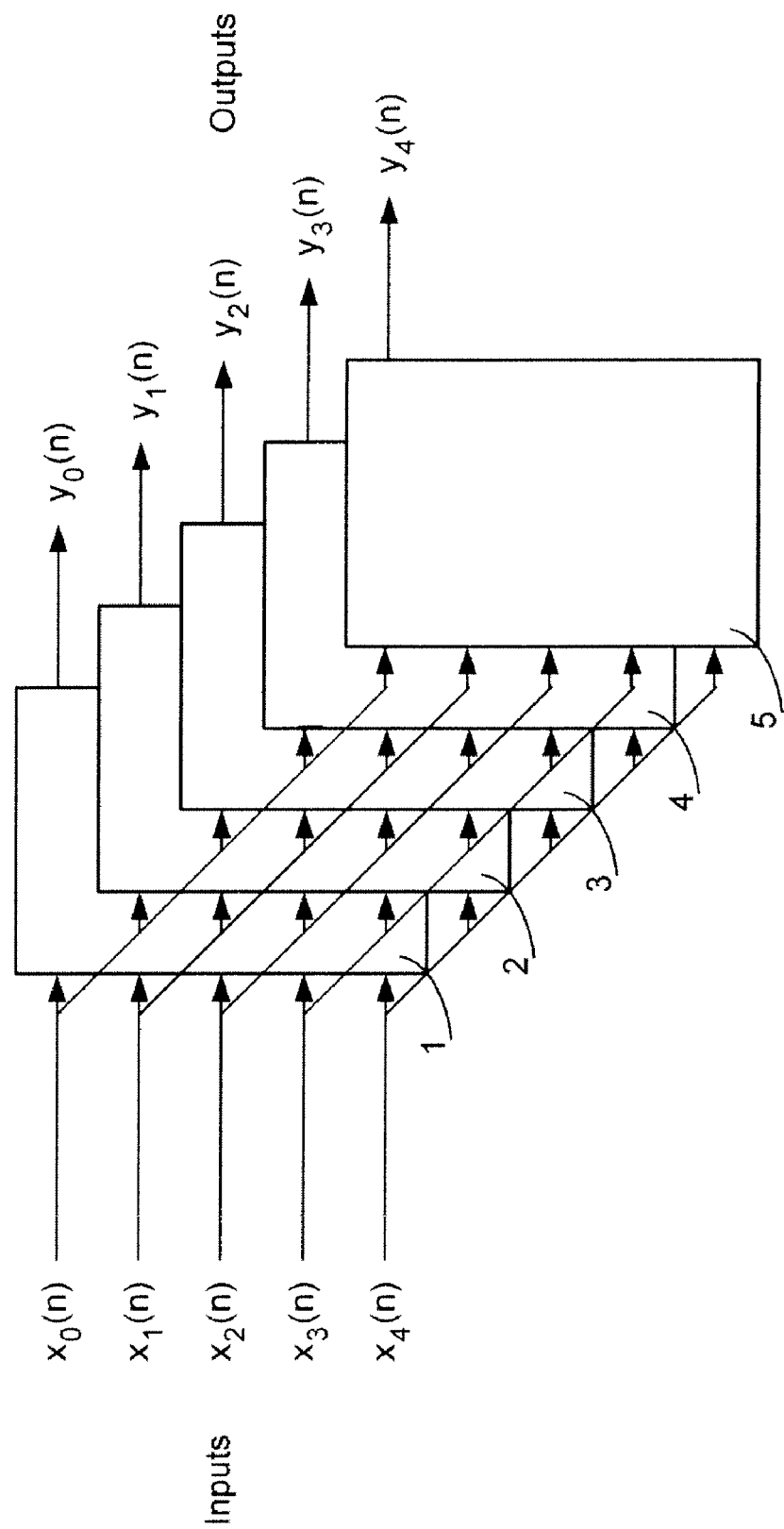
FIG. 3 depicts the joint equalizer for a particular embodiment of P=5 tracks.

Turning to FIG. 3, shown therein is an exemplary embodiment of an equalizer for an joint equalizer with 5 tracks. Intrinsic to the read process is the introduction of two dimensional Inter-Symbol Interference (ISI). The joint equalizer forms part of the solution to the problem of recovering the original data and will be used to perform 2D equalization. Because of differences in the 5 laser spots used, five different 2D equalizers (different coefficients) are required. These 2D equalizers are numbered 1 to 5 in FIG. 3. Each equalizer has its own set of weights, $h_p(i, j)$, where i, p=0 . . . 4 and j=0 . . . 6. The $P_{th}$ equalizer output is $$y_p(n) = \sum_{i=0}^{4} \sum_{j=0}^{6} h_p(i, j) x_i(n-j) \tag{1}$$

Hence a total of $5^2 \times 7$ multiplications are needed to compute the 5 outputs of the joint equalizer of FIG. 3. Though multiplications are not the only operation that contributes to the overall complexity, they are the most significant (when implemented as full parallel multipliers).

Figure 4:
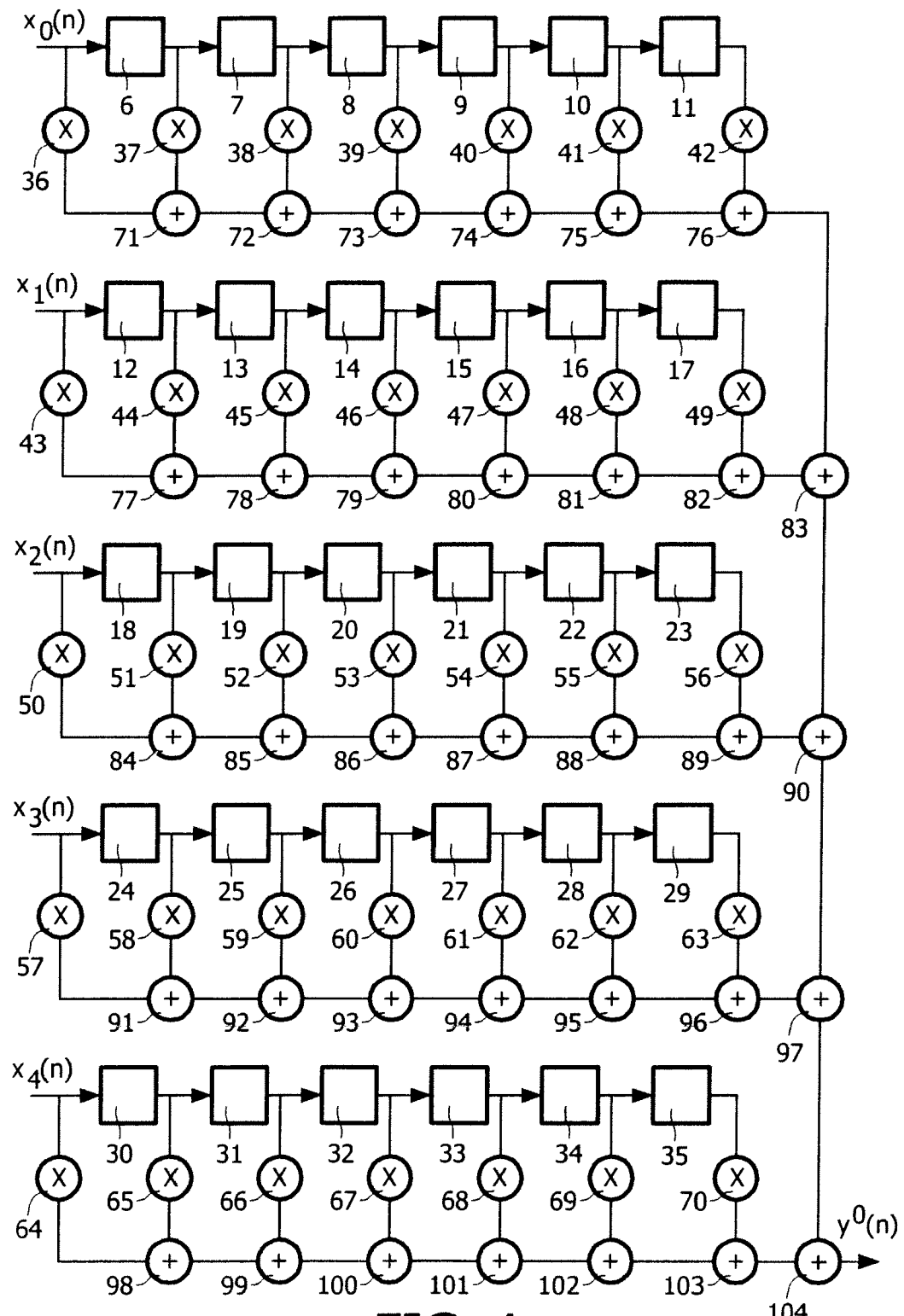
FIG. 4 depicts a conventional Time Domain Equalizer (TDE) embodiment for one of the five individual equalizers of a 5 track joint equalizer.

An exemplary embodiment of an individual 2D Time Domain Equalizer (TDE) is shown in FIG. 4. A total of five of these are required to implement the complete joint equalizer of FIG. 3. The delay elements numbered 6 to 35 store delayed input samples. The multipliers numbered 36 to 70 produce the product terms in equation 1 and the adders numbered 71 to 104 compute the summation in equation 1. The number of multipliers needed is thirty five and the number of adders is thirty four. Other possible time domain embodiments include transpose form and multiply-accumulate architectures and do not effect the number of multiplications and additions required.

Transform-based techniques provide an alternative approach to implementing convolution, which is at the center of digital filtering. Much work has been completed on efficient implementation of transforms, resulting in the family of algorithms under the heading of the Fast Fourier Transforms (FFTs). Such efficient transforms can be utilized with 1 and 2 dimensional signals. For the multi-track equalizer each individual equalizer may appear as a 2-dimensional equalizer, due to the 2-dimensional nature of the data samples and filter coefficients. In the general sense of 2-D filters, the 2-D input is filtered to obtain a 2-D output. However, here the 2-D input is filtered to obtain a 1-D output $y_p(n)$ for each of the 5 equalizers. This has implications for considering transform approaches for the problem. A 2 dimensional transform can map the input into a 2-D transform domain with filtering done in the transformed 2D domain. Applying an inverse transform will involve using all points in 2-D domain.

A more efficient approach using only 1D transforms is now disclosed, whereby a 2D transform is not needed. The filter output $y_p(n)$ in equation 1 can be written as $$y_p(n) = \sum_{i=0}^{4} z_p(i, n) \tag{2}$$

where $$z_p(i, n) = \sum_{j=0}^{6} h_p(i, j)x(i, n - j)$$

which is a linear 1-D row convolution. Each of these 1-D convolutions can be carried out using a transform technique. The summation of the convolutions in equation 2 can be carried out in the transform domain. This 1D approach simplifies forward and inverse transform mappings. This has the significant advantages of requiring 5 one dimensional forward transforms, instead of 1 two dimensional forward transform.

requiring 5 one dimensional inverse transforms, instead of 5 two dimensional inverse transforms.

using less multiplications in the one dimensional transform domain than in the two dimensional transform domain when used to implement linear convolution.

Figure 5:
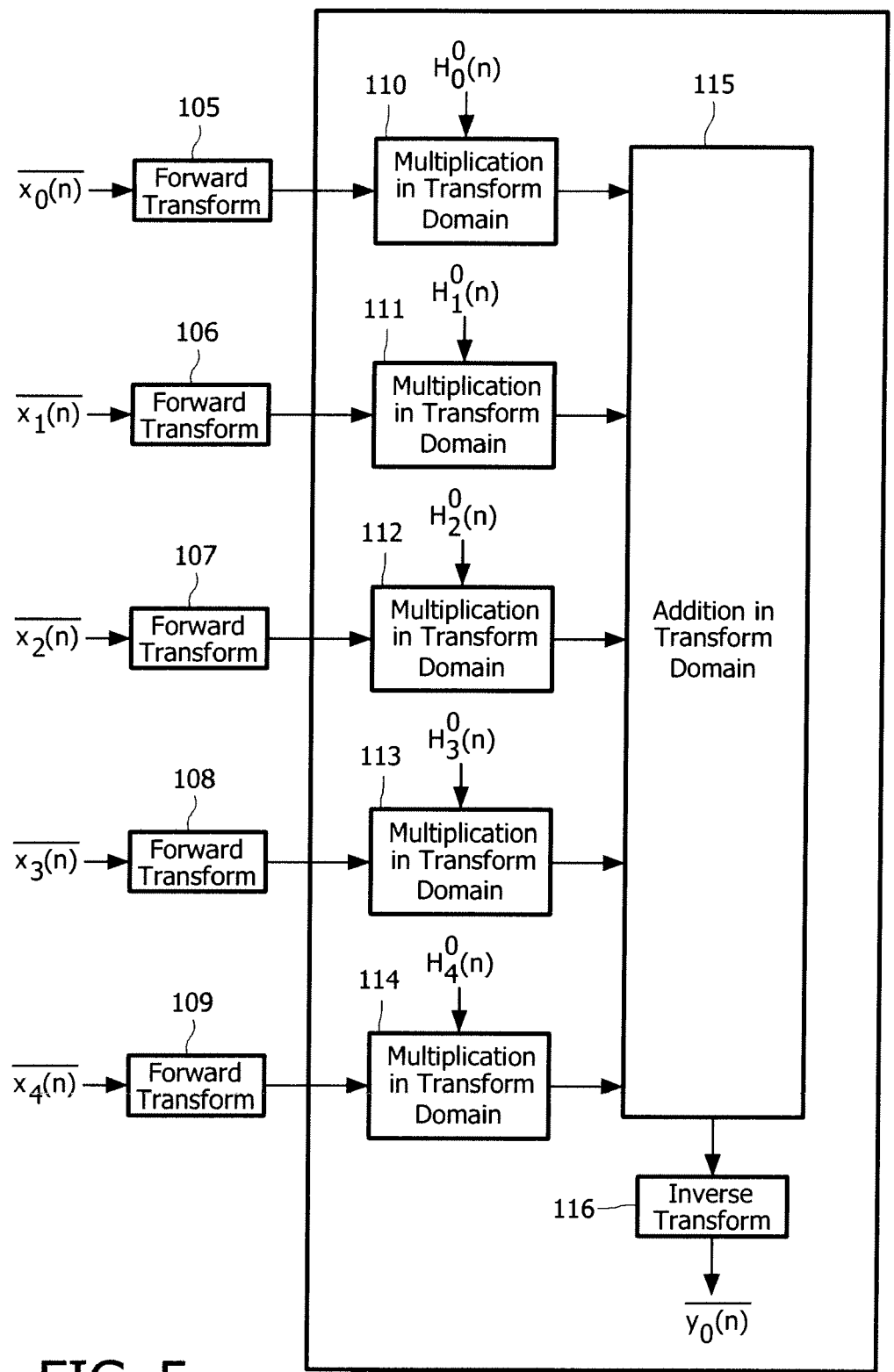
FIG. 5 depicts the proposed Transform Domain Equalizer (TFDE) embodiment for one of the five individual equalizers of a 5 track joint equalizer.

FIG. 5 shows a single equalizer using the proposed 1D transform approach using sixteen points. The one dimensional transforms are numbered 105 to 109 in the figure. The sixteen transform output values from each of the five transforms are then multiplied component wise by the transformed equalizer tap values $H_i^0(n)$. The term $H_i^0(n)$ represents the sixteen transformed coefficient values of the $i^{th}$ row (five rows) for equalizer 1 of FIG. 5 at time n. Multiplication in the transform domain is performed by the components numbered 110 to 114 in FIG. 5, which comprises of eighty (five by sixteen) multipliers for this particular embodiment. The five rows of sixteen multiplied values are then added by component 115 in FIG. 5 to produce one row of sixteen values, which is then inverse transformed using component 116 in FIG. 5 to produce the equalizer output. Using such techniques to implement linear convolution for a long sequence necessitates the use of either overlap-save or overlap-add sectioning. Employing the overlap-save method yields ten valid output values in this embodiment.

The section outlined is repeated for each of the 5 equalizers in the joint equalizer. The forward transform of the input rows only occurs once. This offers the advantage that the 1D forward transform is performed once on each row input, but the transformed values are used more than once by a number of equalizer, therefore reducing the overhead cost of the forward transform.

The complexity analysis is described here for the general case here. The number of rows of the multi-track equalizer is P and the filter tap width is Q. Two cases are considered. Firstly the case of $P \geq Q$. Both P and Q are assumed odd and each equalizer is square, with $$\frac{Q-1}{2}$$

rows above and below the i th row for the i th equalizer. Values for x(i, n) outside the P rows are zero. Therefore the number of non-zero rows in the i th equalizer is $$R_i \begin{cases} \frac{Q-1}{2} + i + 1 & \text{if } i < \frac{Q-1}{2} & (3) \\ Q & \text{if } \frac{Q-1}{2} \leq i \leq P-1-\frac{Q-1}{2} & (4) \\ \frac{Q-1}{2} + P - i + 1 & \text{if } i > P-1-\frac{Q-1}{2} & (5) \end{cases} \quad (6)$$

The total number of rows required for P equalizers is $$S = \sum_{i=0}^{P-1} R_i \quad (7)$$

$$= 2 \sum_{i=0}^{\frac{Q-1}{2}-1} \left(\frac{Q-1}{2} + i + 1\right) + \sum_{i=\frac{Q-1}{2}}^{P-1-\frac{Q-1}{2}} Q$$

$$= 2\left(\frac{Q-1}{2}\left(\frac{Q-1}{2} + 1\right) + \frac{Q-1}{2}\left(\frac{Q-1}{2} - 1\right)\frac{1}{2}\right) +$$

$$Q\left(P - 1 - 2\left(\frac{Q-1}{2}\right) + 1\right)$$

$$= \left(\frac{Q-1}{2}\right)\left(3\frac{Q-1}{2} + 1\right) + Q(P - Q + 1)$$

The second case is that of $$\frac{Q-1}{2} < P < Q.$$

The number of rows in the i th equalizer is $$R_i \begin{cases} \text{MIN}\left(P, \frac{Q-1}{2} + i + 1\right) & \text{if } i < \frac{P-1}{2} & (8) \\ P & \text{if } i = \frac{P-1}{2} & (9) \\ \text{MIN}\left(P, \frac{Q-1}{2}i + 1\right) & \text{if } i > P-1-\frac{P-1}{2} & (10) \end{cases} \quad (11)$$

In this case the number of rows required for the P equalizers that form the joint equalizer is $$S = P + 2 \sum_{i=0}^{\frac{P-1}{2}-1} \text{MIN}\left(P, \frac{Q-1}{2} + i + 1\right) \quad (12)$$

In the time-domain equalizer, each row has Q coefficients. The total number of multiplications is therefore SQ. The total number of additions is SQ–P as each equalizer requires 1 less addition compared to the number of multiplications. The complexity costs per output are Additions per output is $(4+5+5+5+4) \times 7 - 5 = 156$.

Multiplications per output is $(4+5+5+5+4) \times 7 = 161$

For the purposes of complexity analysis using the transform-domain approach, $N=2^K$, which allows the use of an FFT structure for fast forward and inverse transforms. The arithmetic operations required include multiplication by constants, multiplications and additions. A 1D forward transform requires $$\frac{N}{2}\log_2 N$$

multiplication by constants and $N \log_2 N$ additions. The same number of operations are needed for a 1D inverse transform. A total of P forward transforms are required and each of the P individual equalizers requires one 1D inverse transform, making a total of P inverse transforms. In the transformed domain, each individual equalizer requires SN multiplications. The number of additions in the transform-domain for the i th equalizer is $N(R_i-1)$, as only the columns are summed. The total number of additions is then $$\sum_{i=0}^{P-1} N(R_i - 1).$$

To summarize, the number of constant multiplications is $PN \log_2 N$, the number of additions is $2PN \log_2$ $$N + N \sum_{i=0}^{P-1} (R_i - 1)$$

and the number of multiplications is NS. Applying the transform approach and using the overlap-save method, then for $N>Q$, the number of outputs for each equalizer is $N-Q+1$.

The proposed embodiment based on the transform domain technique has P=5 rows and Q=7 row taps, with N=16. The number of constant multiplications required is $5 \times 16 \times \log_2 16 = 320$. The number of additions is $2 \times 5 \times 16 \times \log_2 16 + 16 \times ((4-1)+(5-1)+(5-1)+(5-1)+(4-1))=928$ and the number of multiplications is $16 \times (4+5+5+5+4)=368$. Taking account of the fact that $16-7+1=10$ outputs are generated for each of the 5 equalizers with each block input, this gives the the following complexity measure
Constant multiplications per output is $$\frac{320}{10} = 32.$$

Additions per output is $$\frac{928}{10} = 92.8.$$

Multiplications per output is $$\frac{368}{10} = 36.8.$$

Compared to the time-domain embodiment, the transform domain embodiment exhibits reduced complexity measures. It is noted that transform domain multiplications will be more complex in nature than time domain multiplications, though for low transform lengths (<256), Number Theoretic Transforms (NTTs) can be a practical solution, whereby the the complexity of the the transform domain multiplication is approximately twice that of the time domain multiplication. However, for certain values of N, the number of constant multiplications can be reduced to zero. It will also be readily appreciated that any transform that has the convolution property may be utilized.

Joint Detection is required to account for the existence of intersymbol interference in two dimensions i.e. intersymbol interference along the track as well as intersymbol interference between adjacent tracks. To this end, the Joint Detector must have knowledge of this two dimensional interference. As is well known, this can be achieved by choosing an intersymbol interference target. This can be either predetermined (known as a partial response), programmable or adaptive.

The choice of partial response target depends on the density of recording as well as the sources of noise. For example, in the magnetic recording case, partial responses based on the PR4 and EPR4 targets can be considered and extended to two dimensions. Example two dimensional targets are $$H_{2PR4} = [\alpha, 1, \alpha]^T [1, 0, -1] = \begin{bmatrix} \alpha & 0 & -\alpha \\ 1 & 0 & -1 \\ \alpha & 0 & -\alpha \end{bmatrix} \quad (13)$$

and $$H_{2EPR4} = [\alpha, 1, \alpha]^T [1, 1, -1, -1] = \begin{bmatrix} \alpha & \alpha & -\alpha & -\alpha \\ 1 & 1 & -1 & -1 \\ \alpha & \alpha & -\alpha & -\alpha \end{bmatrix} \quad (14)$$

which are parameterized by the value $\alpha$. Small values of $\alpha$ represent a small side reading response. The case of $\alpha = \frac{1}{2}$ provides an interesting case as the frequency response in the radial direction will have a null at the spatial frequency $1/2d_1$ with $d_1$ representing the track width.

For optical storage, symmetrical targets either based on a rectangular or hexagonal lattice may be considered. Table 1 lists some example responses suitable for optical storage.

TABLE 1

Some example 2D partial responses.

| Response | | $d_{min}$ | $d_{mfb}$ |
|---|---|---|---|
| Rectangular | | | |
| $(1 + D_x)(1 + D_y)$ | $\begin{bmatrix} 1 & 1 \\ 1 & 1 \end{bmatrix}$ | 2 | 2 |
| $(1 + 2D_x + D_x^2)(1 + 2D_y + D_y^2)$ | $\begin{bmatrix} 1 & 2 & 1 \\ 2 & 4 & 2 \\ 1 & 2 & 1 \end{bmatrix}$ | 4 | 6 |
| Hexagonal | | | |
| $(1 + D_u + D_x)$ | $\begin{bmatrix} 1 & 1 \\ & 1 & \end{bmatrix}$ | $\sqrt{3}$ | $\sqrt{3}$ |
| $(1 + D_u)(1 + D_v)$ | $\begin{bmatrix} & 1 & \\ 1 & & 1 \\ & 1 & \end{bmatrix}$ | 2 | 2 |
| $(1 + D_u)(1 + D_x)$ | $\begin{bmatrix} & 1 & 1 \\ 1 & 1 & \end{bmatrix}$ | 2 | 2 |

TABLE 1-continued

Some example 2D partial responses.

| Response | | | $d_{min}$ | $d_{m/b}$ |
|---|---|---|---|---|
| $(1 + D_u)(1 + D_v)(1 + D_x)$ | $\begin{bmatrix} & 1 & 1 \\ 1 & 2 & 1 \\ & 1 & 1 \end{bmatrix}$ | | $\sqrt{6}$ | $\sqrt{10}$ |

While the fixed partial responses listed above can be employed, the best performance can be-achieved through the use of a generalized partial response which can even account for non-linearities. Such a response can be characterized as a list of expected channel samples for each two dimensional bit pattern over a specified support region. The disclosed invention supports such a response as well as fixed partial responses. In fact, it can be appreciated by those with knowledge in the area that a minimum phase type response in which as much of the signal energy as possible is placed (via equalization) toward the front of the target response will perform best with the disclosed invention.

Figure 6:
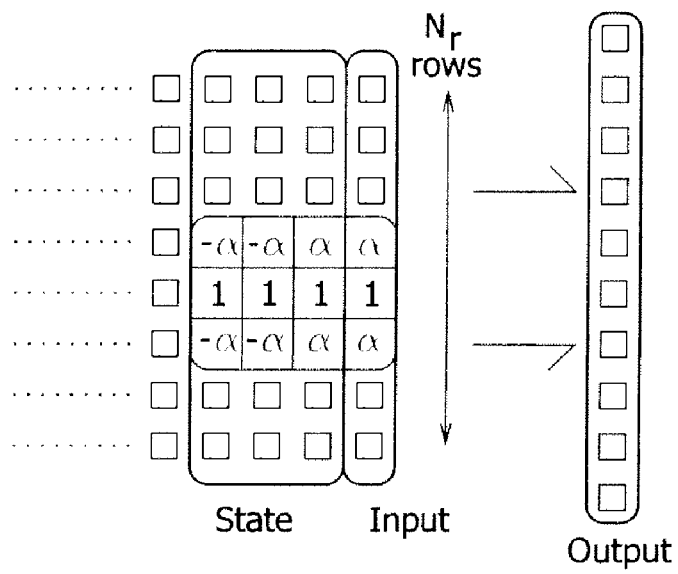
FIG. 6 depicts a two dimensional ISI channel model for a multitrack system.

The optimum detection of data in the presence of ISI can be achieved with maximum likelihood detection through the use of the Viterbi algorithm. In the case of two dimensional ISI, the Viterbi algorithm can also be used but its implementation complexity can be prohibitive. Consider the $H_{2EPR4}$ response with a two dimensional support region of 3 rows in the radial direction and 4 samples in the tangential direction. FIG. 6 shows the basis for a state machine to model the partial response channel.

The state of the channel can be represented as 3 columns of binary data with one column representing the channel input. This information is sufficient to generate one column ($N_r+2$ samples) of channel outputs.

However, this would result in Viterbi detector with $2^{3N_r}$ states each with $2^{N_r}$ branches. For example with a modest $N_r=8$, this would result in excess of $10^7$ states each with 256 branches. This is far too complex to implement at the type of data rates required. Hence a reduction in the complexity of the detector is required. A reduced state version of a multi-track detector is reported, though is only considered for a two track system.

Detection with a Time Varying Trellis.

Figure 7:
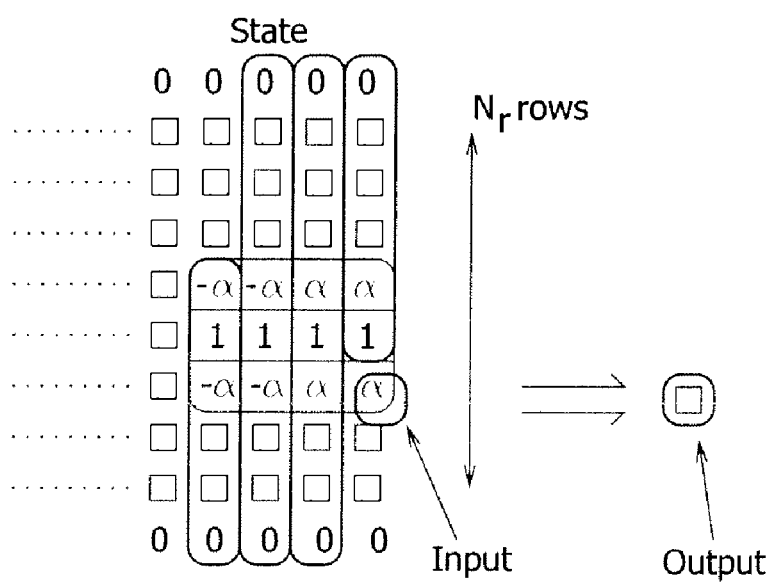
FIG. 7 depicts a time varying one dimensional ISI model of the two dimensional ISI channel.

The disclosed invention achieves practical detection complexity by first modeling the channel as a time varying finite state machine which generates a single output at a time. FIG. 7 shows the state information required. In this case the implicit zeros in the guard band are explicitly shown as they represent important state information. With this model for the example target response, the channel state is represented with $3N_r+2$ bits plus the 6 zero values. With this channel model, the channel can in fact be viewed as a 1 dimensional channel with a time varying response. This could be written as a partial response in terms of a unit delay D as:

$$H_{2EPR4}(D) = \alpha + D + \alpha D^2 + \alpha D^{N_r+2} + D^{N_r+3} + \alpha D^{N_r+4} - \alpha D^{2N_r+4} - D^{2N_r+5} - \alpha D^{2N_r+6} - \alpha D^{3N_r+6} - D^{3N_r+7} - \alpha D^{3N_r+8} \quad (15)$$

and noting the time varying nature with 2 zeros occurring after every $N_r$ channel input bits.

A full Viterbi detector for this channel requires $2^{3N_r+2}$ states which is still prohibitively large. However, each state has only 2 branches. The time varying nature can be handled by simply extending the trellis with a single branch for each of the forced zeros. This time varying property of the trellis is important as it represents key boundary information and failure to use this information will result in a loss in detection performance.

In order to make such a detector structure practical, a reduction in the number of states is required. This can be achieved through the use of the a reduced stated detection. In effect, such an algorithm performs a tree search operation by retaining only M states at each stage in the trellis. Each of the M states are extended to produce 2M candidates of which the best M are retained. In this way, the complexity of the algorithm is related to the parameter M which can be chosen to trade off complexity against the detection performance. The use of such an algorithm in conjunction with the use of the time varying one dimensional model of the two dimensional ISI channel is disclosed in this invention to achieve good performance with modest values of M (for example in the range 8 to 16) which can be practically implemented at the required data rates (in excess of 100s of Megabits per second).

Figure 8:
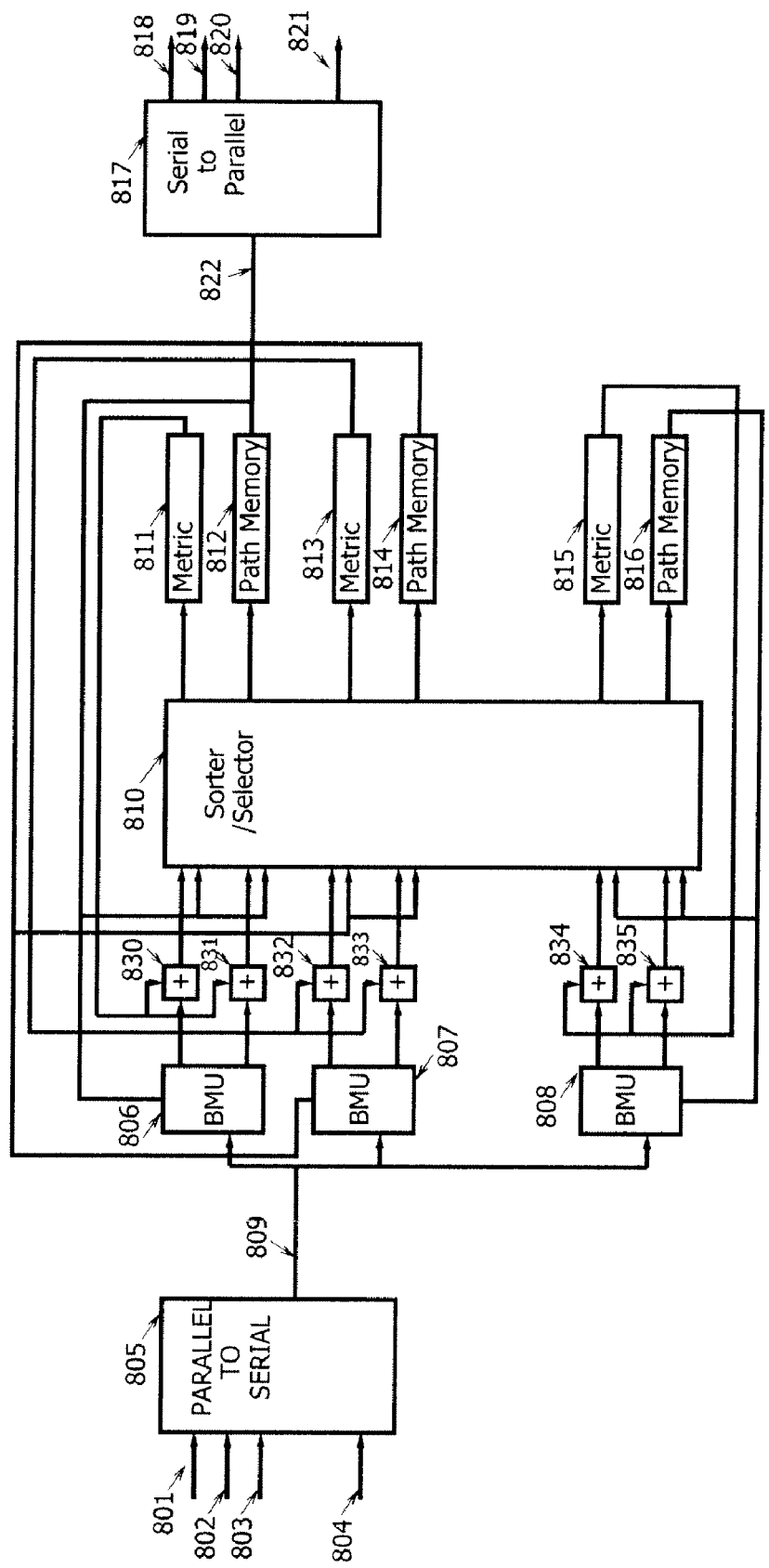
FIG. 8 depicts an implementation of a reduced stated detector for the time varying one dimensional ISI model of the two dimensional ISI channel.

FIG. 8 shows the joint detection structure. The parallel input samples 801,802,803,804 are converted in to a serial stream by the parallel to serial converter 805. The output of this converter 809 is then passed to the branch metric units (BMU). The number of branch metric units required is M and the drawing shows the case of M=3. Hence 3 branch metric units 806,807 and 808 are shown. These units use the serialized sample 809 to compute a 2 branch metrics for each of the M paths that are retained. In the drawing, branch metric unit 806 uses the serialized sample 809 and the bits in the path memory 812 to compute a branch metric for the case of the current input bit being a logic 1 and the current input bit being a logic 0. Similarly, branch metric unit 807 uses the serialized sample 809 and the bits in the path memory 814 to compute a branch metric for the case of the current input bit being a logic 1 and the current input bit being a logic 0 and finally branch metric unit 808 uses the serialized sample 809 and the bits in the path memory 816 to compute a branch metric for the case of the current input bit being a logic 1 and the current input bit being a logic 0. Each of these 2M=6 branch metrics are added to M=3 path metrics. The branch metrics from branch metric unit 806 are added to the corresponding path metric 811, while the branch metrics from branch metric unit 807 are added to the corresponding path metric 813 and the branch metrics from branch metric unit 808 are added to the corresponding path metric 815. The resulting 2M=6 metrics are then sorted in the sorter/selector unit 810 and only the best M=3 path metrics and their corresponding updated path metrics are retained in the path metrics 811, 813 and 815. The path metrics are updated such that a logic 1 is appended if the chosen path metric corresponds to a branch metric output calculated assuming the current input bit being a logic 1. Otherwise a logic 0 is appended if the chosen path metric corresponds to a branch metric output calculated assuming the current input bit being a logic 0.

The time varying nature of the trellis is handled by the parallel to serial converter 805, inserting a sentinel into its output 809 at each boundary. These are recognized by the branch metrics units and acted on such as to produce a best branch metric for the current input bit being a logic 0 and the worst branch metric for the current input bit being a logic 1. In this way the selected M best branch metrics all correspond to path memories with logic 0 values at the boundary positions.

The final decision is delivered as the last bit of the best path memory 812 and output on 822 to a serial to parallel converter. This converts the serial detected bits back to parallel format while ignoring the logic 0 boundary bits.

The selection of the best M paths from 2M candidates is well known and can be achieved by sorting or selection. The key disclosure of the present invention is the representation of the two dimensional interference as a time varying one dimensional interference and the application of the reduced complexity detection via the application of a detector which keeps a relatively small number of survivor paths thus resulting in practical complexity yet good detection performance.

It will be clear to those skilled in the art that the detection system shown in FIG. 8 can be implemented in many similar ways not departing from the spirit of the invention. Furthermore, it will be clear to those skilled in the art that the illustrated figure has a long critical path. However, it will also be clear that the illustrated system can be pipelined and used in a windowed mode to achieve high data throughput rates. Elements of the Invention can be Summarized as Follows:

The data detection apparatus is capable of detecting data in the presence of two dimensional intersymbol interference using one or more parallel input channels and resulting in one or more parallel output data streams.

The method disclosed has as an element one or more signal processing channels operating independently and in parallel and comprises a joint detection processor that uses the signal from one or more of the parallel channels to produce detected data for one or more parallel output data streams.

It further has as an element one or more signal processing channels that operate independently and in parallel and comprises a joint equalizer that uses the signal from one or more of the parallel channels to produce one or more parallel signals that can be used to detected data for one or more parallel output data streams.

A further aspect is that one or more signal processing channels operate independently and in parallel and comprises a joint equalizer that uses the signal from one or more of the parallel channels to produce one or more parallel signals which can be further processed by independent processors and then applied to a joint detection processor that uses the signal from one or more of the parallel channels to produce detected data for one or more parallel output data streams.

Another aspect is that the joint equalizer is implemented by applying any one dimensional transform, which possesses the convolution property, to one or more channels of the equalizer input data and which the transformed data is used to apply equalization by multiplying the transformed data by a predetermined, programmed or adaptive coefficients to produce equalized or partially equalized data in the transform domain.

Another aspect is that the equalized or partially equalized data in the transform domain for one or more channels is summed together and then transformed back to the original signal domain.

Another aspect is that the joint detector is implemented by operating on one or more parallel detector inputs by tracking these inputs as if they resulted from a one dimensional model of a two dimensional intersymbol interference channel.

Another aspect is that the one dimensional model of a two dimensional intersymbol interference channel is time variant, with this time variance representing boundary information.

The boundary information can represent known information.

The detection of the data can be implemented with a reduced state detection method in which only a limited number of all the possible states are considered.

The reduced state detection method can be based on a breadth first search of the time varying trellis.

The one or more parallel detector input data is converted to serial data in which the boundary information is denoted by additional special symbols in the serial information and this serial data is processed in a detector to produce serial data decisions and one or more of these serial data decisions are converted back to parallel data.

The invention claimed is:

1. A method for retrieving bits from a record carrier having the bits stored in marks in a two-dimensional pattern having a width of multiple rows of marks along a reading or writing direction of the two dimensional pattern, where more marks are distributed along a length of the rows than there are marks distributed across the width of the multiple rows, and where sampling the marks results in a sample of the signal waveform for a mark being affected by two dimensional intersymbol interference from adjacent marks, comprising the steps of:
   retrieving a sample;
   processing the sample using a trellis with a set of departure states and a set of arrival states,
   building up the trellis by converting each arrival state to a further departure state for use during a processing of the current sample,
   providing an output bit based on a backtracking operation or trace-back operation along the trellis over a certain backtracking depth, characterized in that the states of the trellis are constructed from the two-dimensional pattern by retrieving each subsequent sample corresponding to an adjacent mark from an adjacent row, that the trellis is a one dimensional trellis, and that each subsequent sample is used as an input for the one dimensional trellis where the two dimensional array of marks is delineated by a boundary row comprising an a priori known boundary information, said a priori boundary information being a forced zero and where the one dimensional trellis is a time variant one dimensional trellis extended with a single branch for each of the forced zeros.

2. A method as claimed in claim 1 where when at a boundary of the two dimensional array the states of the trellis are constructed from the two-dimensional pattern by retrieving a subsequent sample corresponding to an adjacent mark bit from the same row.

3. A method as claimed in claim 2 where the marks corresponding to the subsequent samples form a meandering pattern across the rows.

4. A method as claimed in claim 1 where the marks corresponding to the subsequent samples form a hatch pattern across the rows.

5. A method as claimed in claim 1, where the departure state of the one dimensional trellis comprises a first set of subsections of subsequent bits used when establishing a branch metric and a second a set of subsections of subsequent bits ignored when establishing a branch metric.

6. A method as claimed in claim 5 where a channel response determines which subsequent bits are comprised in the first set of subsections of subsequent bits.

7. A method as claimed in claim 1, where the converting of the arrival state to a further departure state for use during a processing of a next sample comprises performing a tree search operation and retaining only M states at each stage in the trellis.

8. A method as claimed in claim 7, where each state comprises two branches.

9. A data detection apparatus for detecting data in the presence of two dimensional intersymbol interference on a record carrier having bits stored in marks in a two-dimensional pattern having a width of multiple rows of marks along a reading or writing direction of the two dimensional pattern, where more marks are distributed along a length of the rows than there are marks distributed across the width of the multiple rows, and where sampling the marks results in a sample of the signal waveform for a mark being affected by two dimensional intersymbol interference from adjacent marks, the data detection apparatus comprising a signal processor with an input coupled to multiple parallel input channels for processing the samples obtained from the input channels using a trellis with a set of departure states and a set of arrival states, the signal processor further being arranged for building up the trellis by converting the each arrival state to a further departure state for use during a processing of the current sample, the signal processor further comprising an output arranged to provide an output bit based on a backtracking operation or trace-back operation along the trellis over a certain backtracking depth, characterized in that that the data detection apparatus comprises a serialization device that is coupled to the parallel input channels and is arranged to retrieve samples from the parallel input channels and serialize the retrieved samples such that each subsequent sample corresponds to an adjacent mark from an adjacent row and is further arranged to provide the serialized retrieved samples to the signal processor which is arranged to construct the states of the trellis from the serialized retrieved samples, and that the trellis is a one dimensional trellis where the two dimensional array of marks is delineated by a boundary row comprising an a priori known boundary information, said a priori known boundary information being a forced zero and where the one dimensional trellis is a time variant one dimensional trellis extended with a single branch for each of the forced zeros.

10. A data detection apparatus as claimed in claim 9 where when at a boundary of the two dimensional array, the serialization device is arranged to retrieve a subsequent sample corresponding to an adjacent mark bit from the same row.

11. A data detection apparatus as claimed in claim 10 where a set of subsequent samples correspond with a set of marks that form a meandering pattern across the rows.

12. A data detection apparatus as claimed in claim 9 where a set of subsequent samples correspond with a set of marks that form a hatch pattern across the rows.

13. A data detection apparatus as claimed in claim 9, where the departure state of the one dimensional trellis comprises a first set of subsections of subsequent bits used when establishing a branch metric and a second a set of subsections of subsequent bits ignored when establishing a branch metric.

14. A data detection apparatus as claimed in claim 13 where a channel response determines which subsequent bits are comprised in the first set of subsections of subsequent bits.

15. A data detection apparatus as claimed in claim 9 where the converting the arrival state to a further departure state for use during a processing of a next sample comprises performing a tree search operation and retaining only M states at each stage in the trellis.

16. A data detection apparatus as claimed in claim 15, where each state comprises two branches.

* * * * *